(12) United States Patent
Ryu

(10) Patent No.: US 7,901,848 B2
(45) Date of Patent: Mar. 8, 2011

(54) METHOD OF FABRICATING A PHOTOMASK USING SELF ASSEMBLY MOLECULE

(75) Inventor: Jin Ho Ryu, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 131 days.

(21) Appl. No.: 12/345,101

(22) Filed: Dec. 29, 2008

(65) Prior Publication Data

US 2009/0258303 A1    Oct. 15, 2009

(30) Foreign Application Priority Data

Apr. 14, 2008    (KR) .................... 10-2008-0034223

(51) Int. Cl.
G03F 1/00    (2006.01)
G03F 7/20    (2006.01)

(52) U.S. Cl. .......................... 430/5; 430/296

(58) Field of Classification Search .......... 430/5, 430/296, 311–313
See application file for complete search history.

(56) References Cited

U.S. PATENT DOCUMENTS

| 6,297,169 | B1 * | 10/2001 | Mangat et al. | 438/736 |
| 6,586,158 | B2 * | 7/2003 | Dobisz et al. | 430/296 |
| 6,773,865 | B2 * | 8/2004 | Dobisz et al. | 430/296 |
| 2005/0042526 | A1 * | 2/2005 | Lee et al. | 430/5 |
| 2005/0170655 | A1 * | 8/2005 | Bencher et al. | 438/700 |
| 2006/0166108 | A1 | 7/2006 | Chandrachood et al. | |
| 2006/0257751 | A1 * | 11/2006 | Eggers et al. | 430/5 |
| 2010/0015535 | A1 * | 1/2010 | Song et al. | 430/5 |

FOREIGN PATENT DOCUMENTS

| KR | 10-0166837 | 9/1998 |
| KR | 10-2006-0007776 | 1/2006 |
| KR | 10-2007-0109787 | 11/2007 |
| KR | 10-2008-0024053 | 3/2008 |

* cited by examiner

*Primary Examiner* — Stephen Rosasco
*Assistant Examiner* — Stewart A Fraser
(74) *Attorney, Agent, or Firm* — Marshall, Gerstein & Borun LLP

(57) ABSTRACT

A method of fabricating a photomask includes includes forming a light blocking layer over a transparent substrate, and forming a hard mask pattern over the light blocking layer. The hard mask pattern exposes a portion of the light blocking layer. The method also includes depositing a self assembly molecule (SAM) layer over the hard mask pattern. The SAM layer covers the hard mask pattern and a portion of the exposed light blocking layer. The method also includes forming a resist layer pattern over an exposed portion of the light blocking layer that is not covered by the deposited SAM layer. The method further includes removing the SAM layer to expose the hard mask pattern and the light blocking layer, and etching the light blocking layer with the hard mask pattern and the resist layer pattern to form the photomask. Still further, the method includes removing the hard mask pattern and the resist layer pattern. The disclosed method permits one to manufacture fine patterns in semiconductor devices utilizing conventional apparatus and materials.

16 Claims, 7 Drawing Sheets

METHOD OF FABRICATING A PHOTOMASK USING SELF ASSEMBLY MOLECULE

CROSS-REFERENCE TO RELATED APPLICATION

The priority of Korean patent application No. 10-2008-0034223 filed Apr. 14, 2008, the disclosure of which is incorporated by reference in its entirety, is claimed.

BACKGROUND OF THE INVENTION

The invention generally relates generally to a method of fabricating a photomask, and more particularly, to a method of fabricating a photomask using a Self Assembly Molecule (SAM).

Generally, a semiconductor device is formed of numerous patterns. These patterns are made by a photolithography process that includes exposure, development, and etch processes, using a photoresist layer pattern as an etch mask. More specifically, the exposure process is one in which the pattern on a photomask is transferred to a photoresist layer on a wafer. Therefore, when the pattern on the photomask is not accurately formed, it is impossible to obtain the desired photoresist layer pattern.

Recently, as degree of semiconductor device integration has increased, the size of the pattern has decreased and and become finer. Presently, an electron beam lithography method or a laser beam method are typically used as a method of forming patterns on the photomask. In a phase shift mask, for example, a phase shift layer, a chrome layer, and a resist layer are sequentially formed on a transparent substrate. Next, a resist layer pattern is formed by performing exposure and development by an electron beam lithography or a laser beam lithography on the resist layer. A phase shift layer pattern and a chrome layer pattern that expose a light transmitting region of the transparent substrate are formed by sequentially removing the exposed portions of the chrome layer and the phase shift layer, using the resist layer pattern as an etch mask. Then, the resist layer pattern is removed, and the chrome layer pattern in the rest portion except for a frame region is subsequently removed.

Although exposure by the electron lithography method or a laser beam lithography method makes it easy to form fine patterns, compared to an exposure by a photolithography method, there are various problems in forming ultra fine patterns due to the rapid increase in the integration degree of semiconductor devices. For example, the lithography apparatus, the exposure apparatus, development apparatus, and the etching apparatus should be continuously improved to obtain and ensure more fine patterns. Also, development of a resist layer material required in the electron beam lithography process or a laser beam lithography process should be performed together. However, now, the improvement of the apparatus and development of the material cannot keep up with required increase in the integration degree.

SUMMARY OF THE INVENTION

Embodiments of the present invention are directed to a method of fabricating a photomask (e.g., a binary photomask, a phase shift mask) using self assembly molecules. The method is capable of forming fine patterns and can be carried out using conventional exposure apparatus and resist layer material.

According to one embodiment, the method includes forming a light blocking layer over a transparent substrate, and forming a hard mask pattern over the light blocking layer. The hard mask pattern exposes a portion of the light blocking layer. The method also includes depositing a self assembly molecule (SAM) layer over the hard mask pattern. The SAM layer covers the hard mask pattern and a portion of the exposed light blocking layer. The method also includes forming a resist layer pattern over an exposed portion of the light blocking layer that is not covered by the deposited SAM layer. The method further includes removing the SAM layer to expose the hard mask pattern and the light blocking layer, and etching the light blocking layer with the hard mask pattern and the resist layer pattern to form the photomask. Still further, the method includes removing the hard mask pattern and the resist layer pattern.

According to another embodiment, a method of fabricating a phase shift includes forming a phase shift layer and a light blocking layer over a transparent substrate and forming a hard mask pattern over the light blocking layer. The hard mask pattern exposes a portion of the light blocking layer. The method also includes depositing a self assembly molecule (SAM) layer over the hard mask pattern. The SAM layer covers the hard mask pattern and a portion of the exposed light blocking layer. The method also includes forming a resist layer pattern over an exposed portion of the light blocking layer that is not covered by the SAM layer. The method further includes removing the SAM layer to expose the hard mask pattern and the light blocking layer, and etching the light blocking layer with the hard mask pattern and the resist layer pattern to form the photomask. Still further, the method includes removing the phase shift layer exposed by the photomask, the hard mask pattern, and the resist layer pattern. The method also includes removing the hard mask pattern, the photomask, and the resist layer pattern.

In these various embodiments, the hard mask pattern may be made of or include a gold (Au) material.

Formation of the hard mask pattern can include forming a resist layer over the hard mask layer, and exposing the resist layer and developing the exposed resist layer to form a resist layer pattern. The resist layer pattern can have an opening that exposes a portion of the hard mask layer. The exposed portion of the hard mask layer can be etched, using the resist layer pattern as an etch mask, to form the hard mask pattern, and the resist layer pattern can be removed. The hard mask pattern preferably has an opening that exposes a portion of the light blocking layer.

The hard mask pattern opening preferably has a width that is three times that of the hard mask pattern.

Deposition of the SAM layer preferably includes dipping the substrate in a SAM solution.

Preferably, in the SAM solution, an end of each self assembly molecule is substituted with a sulfur (S) atom, which atom is preferably also connected to the self assembly molecule by an alkyl group.

The exposed portion of the light blocking layer not covered by the SAM layer preferably has a width that is controllable by controlling the length of the alkyl group.

Preferably the resist layer is a negative type resist layer.

Preferably, removal of the SAM layer can be accomplished by and/or include performing an ammonia treatment method.

According to the present invention, spontaneous reaction of self assembly molecules with the hard mask pattern makes it possible to form accurately fine patterns, compared to existing lithography methods. Therefore, it is possible to easily form the fine patterns only using currently conventionally used exposure apparatus and resist layer material.

Additional features of the disclosed invention may become apparent to those skilled in the art from a review of the following detailed description, taken in conjunction with the drawings and the appended claims.

BRIEF DESCRIPTION OF THE DRAWINGS

For a more complete understanding of the disclosure, reference should be made to the following detailed description and accompanying drawings wherein.

Figure 1:
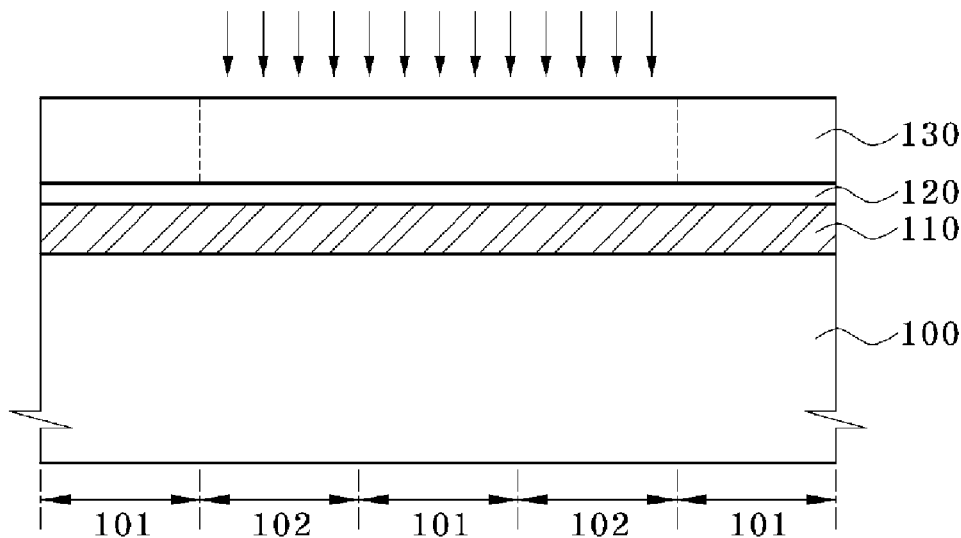
FIGS. 1 through 6 are cross-sectional views illustrating a method of fabricating a binary photomask according to an embodiment of the present invention.

While the disclosed methods are susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DETAILED DESCRIPTION

Figure 5:
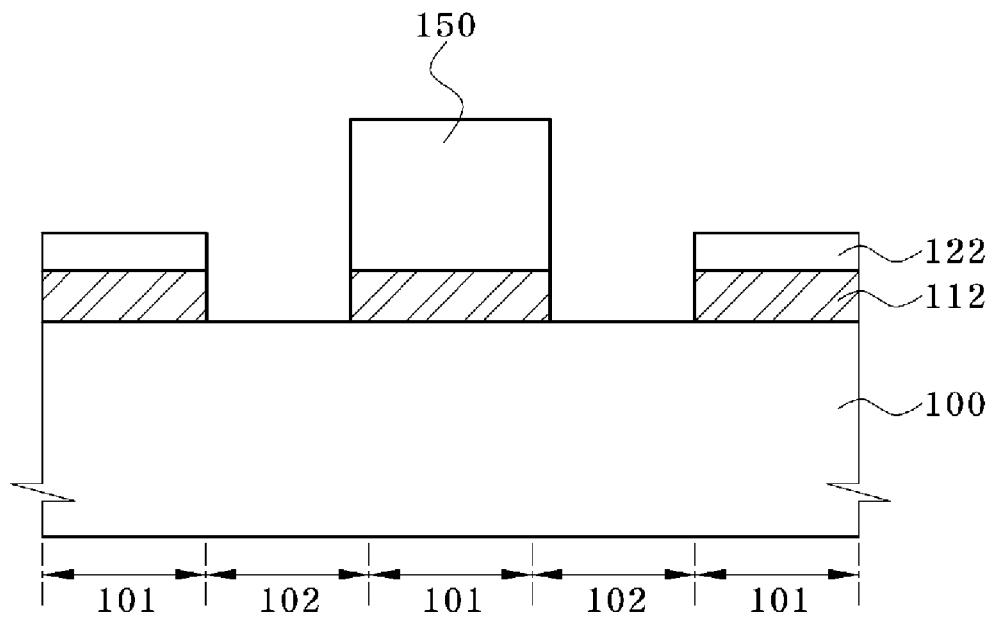
Figure 6:
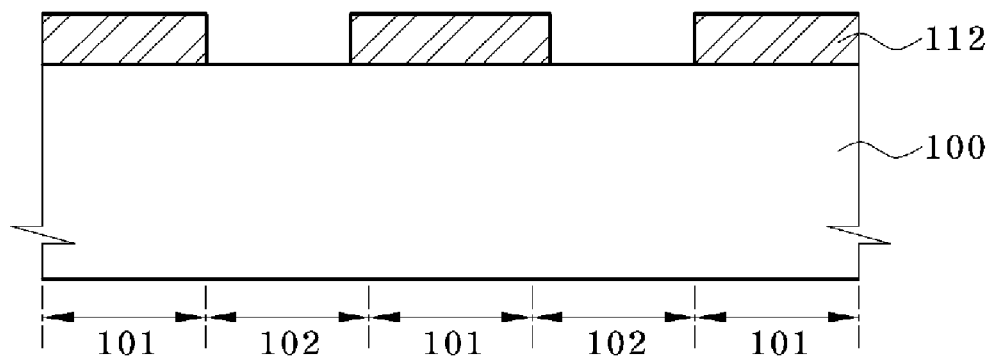
Figure 7:
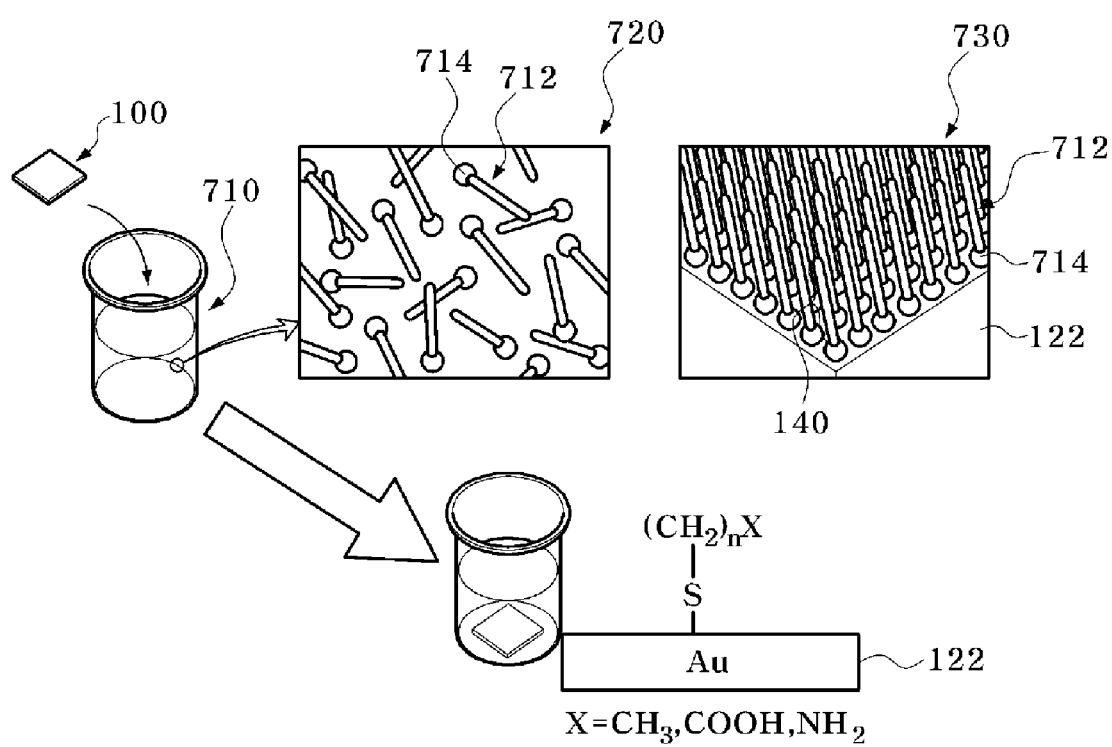
FIG. 7 is a view illustrating a process of forming a self assembly molecule layer; and, FIGS. 8 through 13 are cross-sectional views illustrating a method of fabricating a phase shift mask according to another embodiment of the present invention.

FIGS. 1 through 6 are cross-sectional views illustrating a method of fabricating a (binary) photomask according to an embodiment of the present invention. FIG. 7 is a view illustrating a process of forming a self assembly molecule layer. Referring now to FIG. 1, a light blocking layer 110 is formed over a transparent substrate 100. The substrate 100 preferably has a first region 101 and a second region 102. The first region 101 preferably is a light blocking region on which a light blocking pattern is disposed, and the second region 102 preferably is a light transmitting region in which the transparent substrate 100 is exposed. Quartz may be used, for example, as the transparent substrate 100, and a chrome (Cr) layer may be used for the light blocking layer 110. Next, a hard mask layer 120 is formed over the light blocking layer 110. The hard mask layer 120 is formed of a material capable of inducing an absorption reaction with a self assembly molecule (SAM) layer to be subsequently formed. For example, the hard mask layer 120 preferably is formed of a gold (Au) material. Next, a resist layer 130 is formed over the hard mask layer 120, and an electron beam exposure to the resist layer 130 is performed, as shown by arrows. In some cases, a laser beam exposure may be performed instead of the electron beam exposure.

Figure 2:
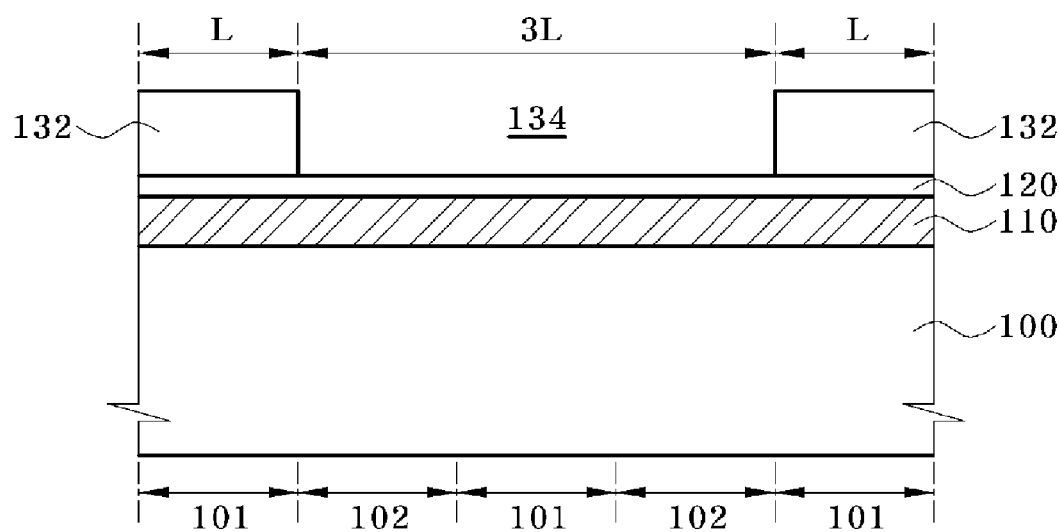
Figure 3:
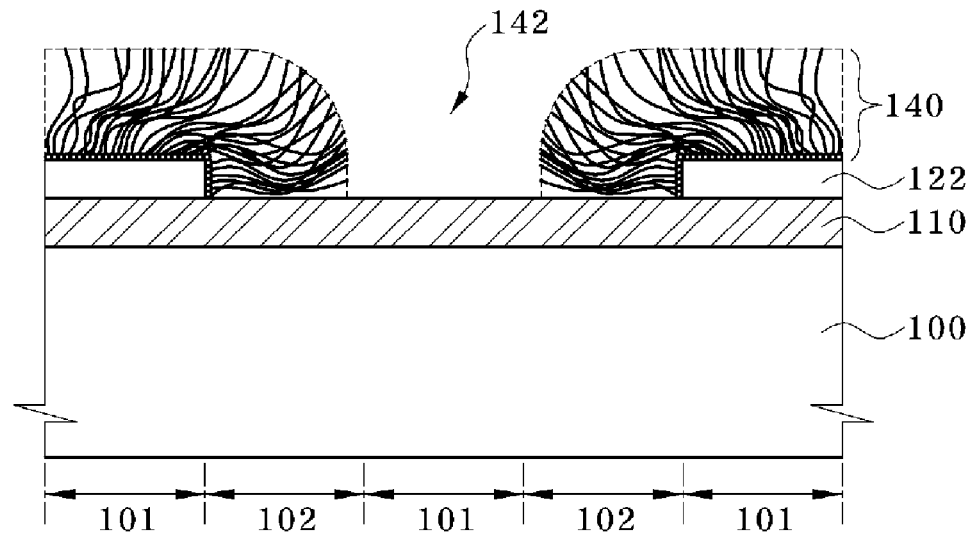

Next, referring to FIG. 2, a resist layer pattern 132 is formed by developing those portions of the resist layer (130 in FIG. 1) that were exposed to the electron beam. The resist layer pattern 132 has an opening 134 that exposes a portion of the hard mask layer 120. The resist layer pattern 132 has a first width L and the opening 134 has a second width 3L that is as about three times as the first width L. Thus, the exposed portion of the hard mask layer 120 similarly has the same second width 3L. Control of these widths can be performed upon the electron beam exposure. Next, the exposed portion of the hard mask layer 120 is etched using the resist layer pattern 132 as an etch mask to form a hard mask pattern 122 shown in FIG. 3.

Next, a SAM layer 140 is deposited (formed) over the upper and side surfaces of the hard mask pattern 122. The SAM layer 140 covers the hard mask pattern 122 and a portion of the exposed light blocking layer 110. In order to form the SAM layer 140, as shown in FIG. 7, the transparent substrate 100 formed with the hard mask layer pattern 122 is dipped in a solution 710 (shown in more detail in the exploded view denoted by reference number 720) of self assembly molecules 712. Ends of the self assembly molecules 712 in the SAM solution 710 are substituted with sulfur (S) atoms 714. These sulfur (S) atoms 714 are connected to a molecule of an alkyl group (e.g. $(CH_2)_n X$, wherein, X is $CH_3$, COOH, $NH_3$). When the transparent substrate formed with the hard mask layer pattern 122 is dipped in the SAM solution 710, the sulfur (S) atoms 714 of the SAM 712 in the SAM solution 710 are absorbed to the gold material of the hard mask pattern 122 and, as a result, the unit SAMs are absorbed to the hard mask pattern 122 as shown by a reference numeral "730" and the SAM layer 140 is formed. The deposited SAM layer 140 covers the hard mask pattern 122 and a portion of the exposed light blocking layer. As shown, the deposited SAM layer 140 leaves an opening 142 that exposes the first region 101 (i.e. the light blocking region of the exposed portion of the light blocking layer 110). The width of the opening 142 (and, therefore, the portion of the exposed light blocking pattern not covered by the deposited SAM layer 140) can be adjusted by controlling a length of the alkyl group of the SAM that constitutes the SAM layer 140.

Figure 4:
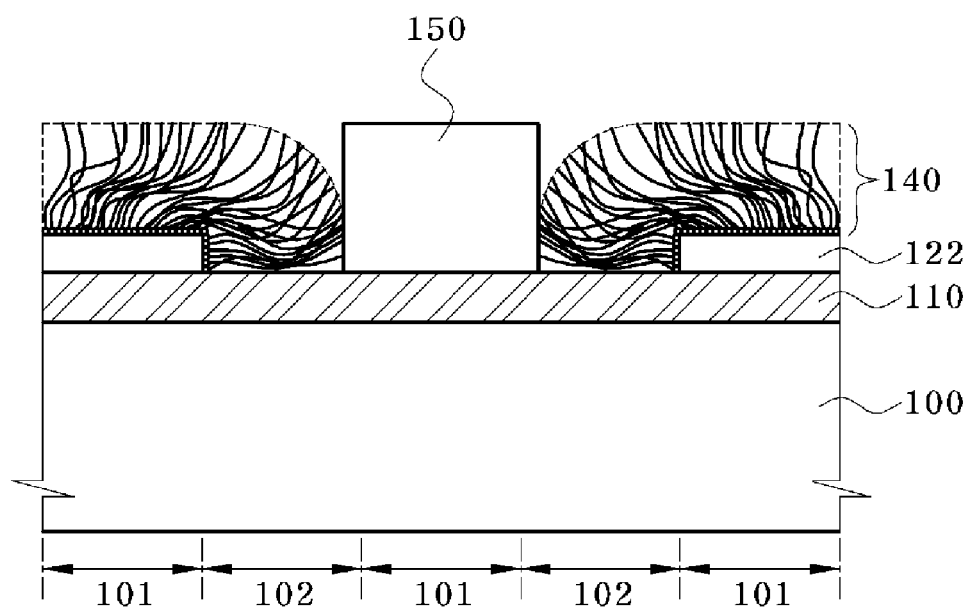

Next, referring to FIG. 4, a resist layer pattern 150 is formed in the opening 142 by the SAM layer 140. To this end, a negative type resist layer is preferably coated over an entire surface, and is then exposed and developed to form the resist layer pattern 150. Light is restrictively irradiated to the opening (142 in FIG. 3) upon the exposure, and the portion irradiated by the light thus remains upon the development. Therefore, the resist layer pattern 150 that is restricted in the opening 142 is formed. After that, surfaces of the SAM layer 140 and the resist layer pattern 150 are planarized by performing planarization such as Chemical Mechanical Polishing (CMP).

Next, as shown in FIG. 5, the SAM layer (140 in FIG. 4) is removed. The removal of the SAM layer 140 may be performed using an ammonia treatment method. As the SAM layer 140 is removed, the hard mask pattern 122 is exposed. Next, the light blocking layer (110 in FIG. 4) is etched, using the hard mask pattern 122 and the resist layer pattern 150 as an etch mask, to form a light blocking layer pattern (i.e., a photomask) 112. The formed photomask 112 exposes the surface of the second region 102 (i.e. the light transmitting region) of the transparent substrate 100. Next, as shown in FIG. 6, the hard mask pattern (122 in FIG. 5), and the resist layer pattern (150 in FIG. 5) are removed, thereby fabricating a (binary) photomask in which the photomask 112 is disposed in the first region 101 (i.e., the light blocking region) and the transparent substrate 100 is exposed in the second region 102 (i.e., the light transmitting region).

Figure 8:
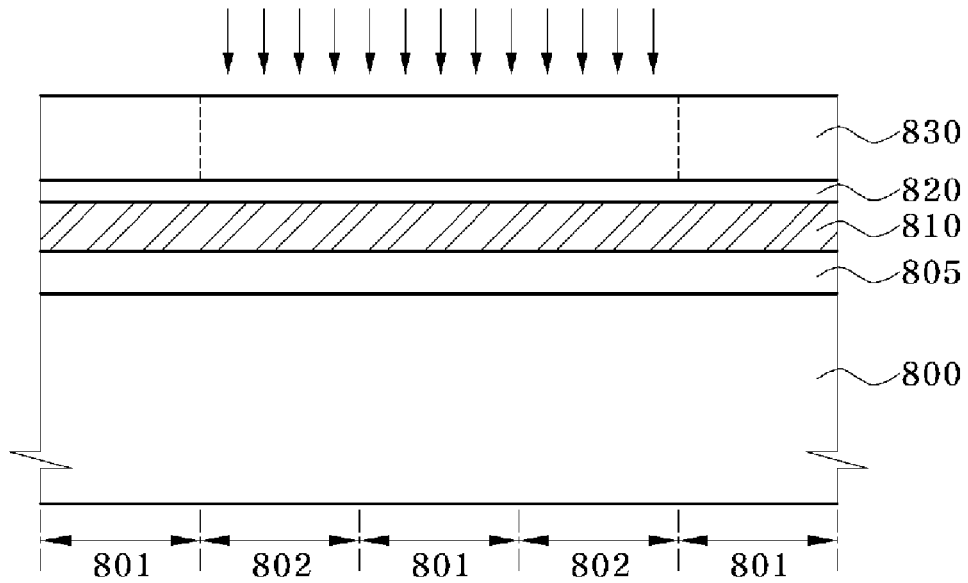

FIGS. 8 through 13 are cross-sectional views illustrating a method of fabricating a phase shift mask according to another embodiment of the present invention. First, as shown in FIG. 8, a phase shift layer 805 and a light blocking layer 810 are sequentially formed over a transparent substrate 800. The substrate 800 is shown having a first region 801 and a second region 802. The first region 801 preferably is a phase shift region on which a phase shift layer pattern is disposed, and the second region 802 preferably is a light transmitting region in which the transparent substrate is exposed. Quartz may be used, for example, as the transparent substrate 800, a molybdenum silicon layer may be used for the phase shift layer 805, and a chrome (Cr) layer may be used for the light blocking layer 810. Next, a hard mask layer 820 is formed over the light blocking layer 810. The hard mask layer 820 is formed of a material capable of inducing an absorption reaction with a SAM layer to be subsequently formed. For example, the hard mask layer 820 preferably is formed of a gold (Au) material. Next, a resist layer 830 is formed over the hard mask layer 820, and an electron beam exposure to the resist layer 830 is performed, as shown by arrows. In some cases, a laser beam exposure may be performed instead of the electron beam exposure.

Figure 9:
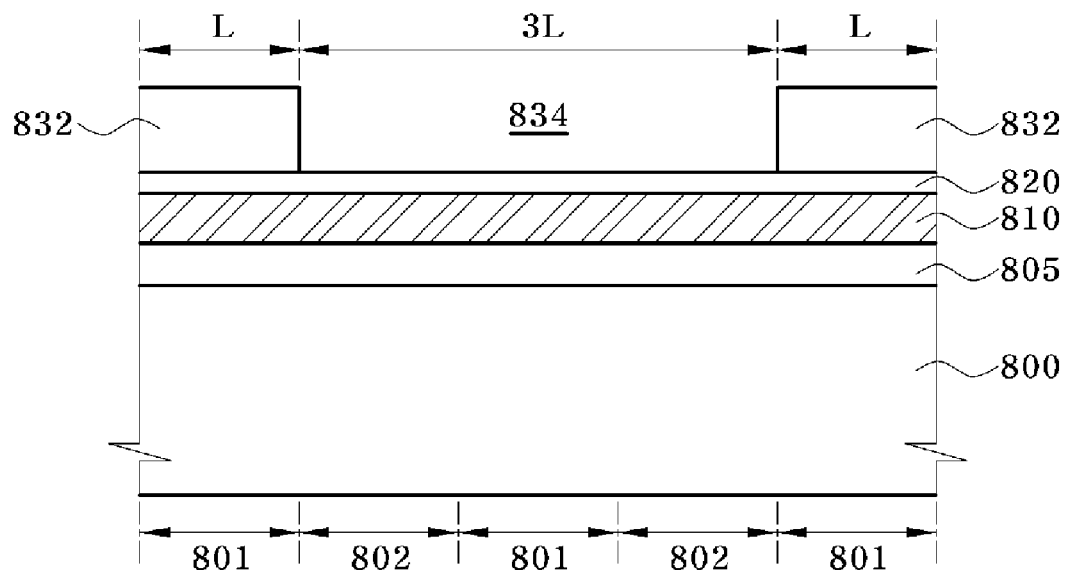
Figure 10:
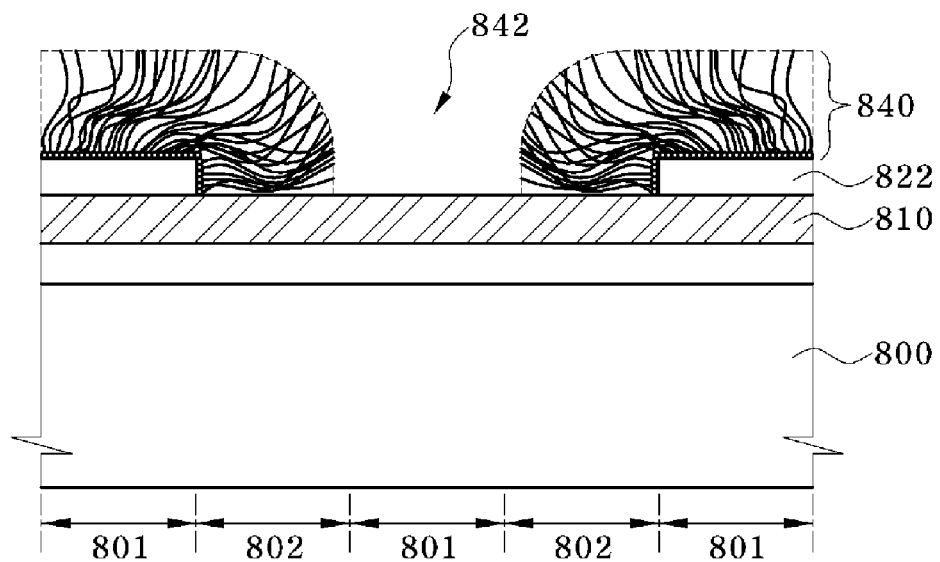

Next, referring to FIG. 9, a resist layer pattern 832 is formed by developing those portions of the resist layer (830 in FIG. 8) that were exposed to the electron beam. The resist layer pattern 832 has an opening 834 that exposes a portion of the hard mask layer 820 between the resist layer patterns 832. The resist layer pattern 832 has a first width L and the opening 834 has a second width 3L that is as about three times as the first width L. Thus, the exposed portion of the hard mask layer 820 similarly has the same second width 3L. Control of these widths can be performed upon the electron beam exposure. Next, the exposed portion of the hard mask layer 820 is etched using the resist layer pattern 832 as an etch mask to form a hard mask pattern 822 shown in FIG. 10.

Next, a SAM layer 840 is deposited (formed) over the upper and side surfaces of the hard mask pattern 822. The SAM layer 840 covers the hard mask pattern 822 and a portion of the exposed light blocking layer 810. The method of forming the SAM layer 840 is the same as that described with reference to FIG. 7. That is to say, the transparent substrate formed with the hard mask layer pattern 822 is dipped in the SAM solution. Ends of the self assembly molecules 712 in the SAM solution 710 are substituted by sulfur (S) atoms 714. These sulfur (S) atoms 714 are connected to a molecule of an alkyl group (e.g., $(CH_2)_n X$, wherein, X is $CH_3$, COOH, $NH_3$). Therefore, when the transparent substrate formed with the hard mask pattern 822 is dipped in the SAM solution, the sulfur (S) atoms 714 of the SAM 712 in the SAM solution 710 are absorbed to the gold material of the hard mask pattern 822 and, as a result, the unit SAMs are absorbed to the hard mask pattern 822 and the SAM layer 840 is formed. The deposited SAM layer 840 covers the hard mask pattern 822 and a portion of the exposed light blocking layer. As shown, the deposited SAM layer 840 leaves an opening 842 that exposes the first region 801 (i.e., the light blocking region of the exposed portion of the light blocking layer 810).

Figure 11:
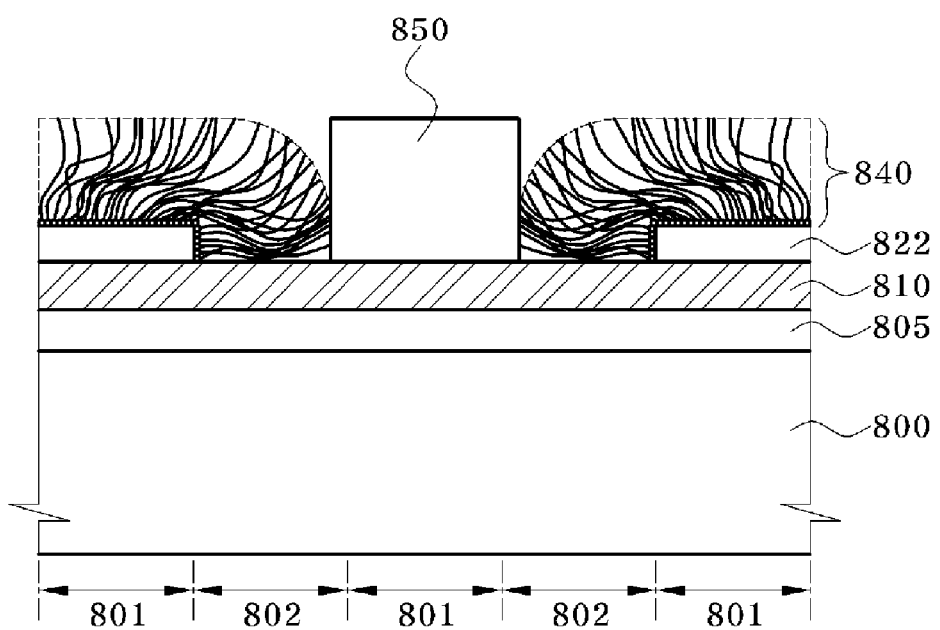

Next, as shown in FIG. 11, a resist layer pattern 850 is formed in the opening 842 by the SAM layer 840. To this end, a negative type resist layer preferably is coated over an entire surface, and is then exposed and developed to form the resist layer pattern 850. Light is restrictively irradiated to the opening (842 in FIG. 10) upon the exposure, and the portion irradiated by the light thus remains upon the development. Therefore, the resist layer pattern 850 that is restricted in the opening 842 is formed. After that, surfaces of the SAM layer 840 and the resist layer pattern 850 are planarized by performing planarization such as CMP.

Figure 12:
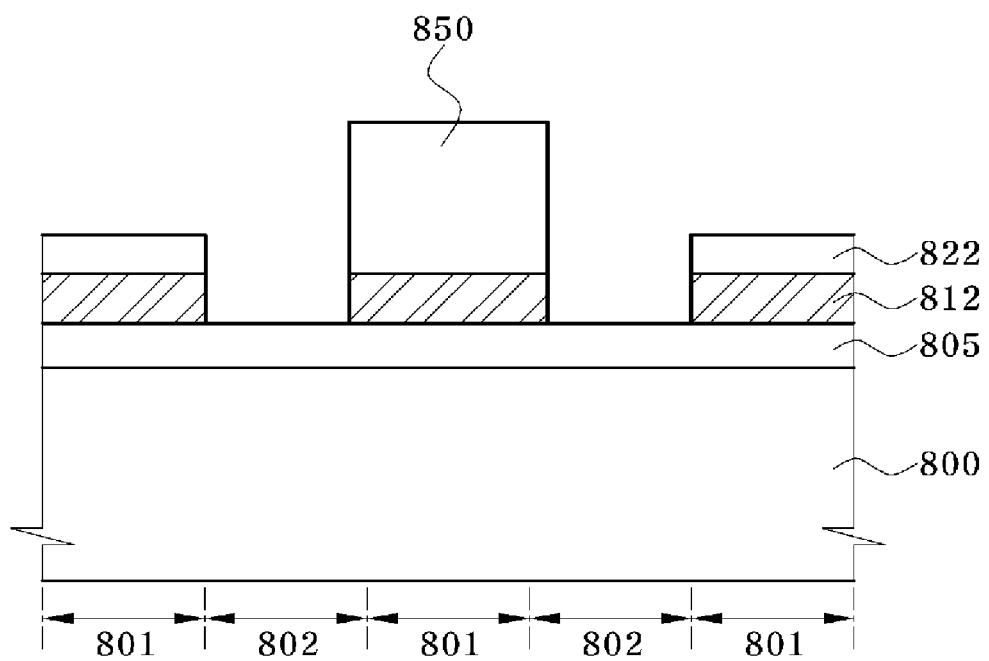
Figure 13:
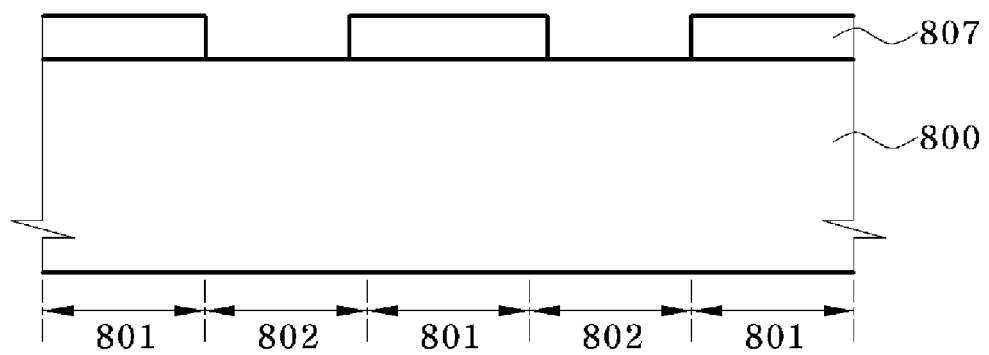

Next, as shown in FIG. 12, the SAM layer (840 in FIG. 11) is removed. The removal of the SAM layer 840 may be performed using an ammonia treatment method. As the SAM layer 840 is removed, the hard mask pattern 822 is exposed. Next, the light blocking layer (810 in FIG. 11) is etched, using the hard mask pattern 822 and the resist layer pattern 850 as an etch mask, to form a light blocking layer pattern (i.e., a photomask) 812. The formed photomask 812 exposes the surface of the phase shift layer 805 in the light transmitting region. Next, as shown in FIG. 13, a phase shift layer pattern 807 that exposes the transparent substrate 800 in the second region 802 (i.e., the light transmitting region) is etched to the exposed portion of the phase shift layer (805 in FIG. 12). Then, the hard mask pattern (822 in FIG. 12), the resist layer pattern (850 in FIG. 12), and the photomask (812 in FIG. 12) are removed, thereby fabricating a phase shift layer pattern (i.e., phase shift mask) 807 that is disposed in the first region 801 (i.e. the light blocking region) and the transparent substrate 100 is exposed in the second region 802 (i.e. the light transmitting region).

While the present invention has been described with respect to the specific embodiments, it will be apparent to those skilled in the art that various changes and modifications may be made without departing from the spirit and scope of the invention as defined in the following claims.

What is claimed is:

1. A method of fabricating a photomask, the method comprising:
    forming a light blocking layer over a transparent substrate;
    forming first and second hard mask patterns over the light blocking layer, the first and second hard mask patterns having a same first width, and an opening between the first and second hard mask patterns having a second width that is three times the first width;
    forming a self assembly molecule (SAM) layer having a length of the first width over the sides of the first and second hard mask patterns, the SAM layer exposing a first width of the light blocking layer;
    forming a resist layer pattern having the first width of the light blocking layer over the light blocking layer exposed by the SAM layer;
    removing the SAM layer to expose the light blocking layer covered by the SAM layer;
    etching the exposed portion of the light blocking layer to form a light blocking layer pattern; and,
    removing the first and second hard mask patterns and the resist layer pattern.

2. The method of claim 1, wherein the first and second hard mask patterns comprise a gold (Au) material.

3. The method of claim 1, wherein formation of the first and second hard mask patterns comprise:
    forming a resist layer over the hard mask layer;
    exposing the resist layer and developing the exposed resist layer to form a resist layer pattern, the resist layer pattern having an opening that exposes a portion of the hard mask layer;
    etching the exposed portion of the hard mask layer, using the resist layer pattern as an etch mask, to form the first and second hard mask patterns, the first and second hard mask patterns having an opening that exposes a portion of the light blocking layer; and
    removing the resist layer pattern.

4. The method of claim 1, wherein deposition of the SAM layer comprises dipping the substrate in a SAM solution.

5. The method of claim 4, wherein an end of each self assembly molecule is substituted with a sulfur (S) atom, the sulfur. (S) atom being connected to the self assembly molecule by an alkyl group.

6. The method of claim 5, wherein the exposed portion of the light blocking layer not covered by the SAM layer has a width, the width controllable by controlling the length of the alkyl group.

7. The method of claim 1, wherein the resist layer is a negative type resist layer.

8. The method of claim 1, wherein removal of the SAM layer comprises performing an ammonia treatment method.

9. A method of fabricating a phase shift mask, the method comprising:
    forming a phase shift layer and a light blocking layer over a transparent substrate;

forming first and second hard mask patterns over the light blocking layer, the first and second hard mask patterns having a same first width, and opening between the first and second hard mask patterns having a second width that is three times the first width;

forming a self assembly molecule (SAM) layer having a length of the first width over the sides of the first and second hard mask patterns, the SAM layer exposing a first width of the light blocking layer;

forming a resist layer pattern having the first width of the light blocking layer over the light blocking layer exposed by the SAM layer;

removing the SAM layer to expose the light blocking layer covered by the SAM layer;

etching the exposed portion of the light blocking layer to form a light blocking layer pattern;

removing the phase shift layer exposed by the light blocking layer pattern, the first and second hard mask layer patterns, and the resist layer pattern to form a phase shift mask pattern; and, removing the first and second hard mask patterns, the light blocking layer pattern, and the resist layer pattern.

10. The method of claim 9, wherein the first and second hard mask patterns comprise a gold (Au) material.

11. The method of claim 9, wherein formation of the first and second hard mask patterns comprise:

forming a resist layer over the hard mask layer;

exposing the resist layer and developing the exposed resist layer to form a resist layer pattern, the resist layer pattern having an opening that exposes a portion of the hard mask layer;

etching the exposed portion of the hard mask layer, using the resist layer pattern as an etch mask, to form the first and second hard mask patterns, the first and second hard mask patterns having an opening that exposes a portion of the light blocking layer; and removing the resist layer pattern.

12. The method of claim 9, wherein deposition of the SAM layer comprises dipping the substrate in a SAM solution.

13. The method of claim 12, wherein an end of each self assembly molecule is substituted with a sulfur (S) atom, the sulfur (S) atom being connected to the self assembly molecule by an alkyl group.

14. The method of claim 13, wherein the exposed portion of the light blocking layer not covered by the SAM layer has a width, the width controllable by controlling the length of the alkyl group.

15. The method of claim 9, wherein the resist layer is a negative type resist layer.

16. The method of claim 9, wherein removal of the SAM layer comprises performing an ammonia treatment method.

* * * * *